United States Patent [19]

Ohishi

[11] Patent Number: 4,835,612
[45] Date of Patent: May 30, 1989

[54] VIDEO SIGNAL MEMORY APPARATUS AND METHOD WHICH EXCLUDES STORAGE OF BLANKING SIGNALS

[75] Inventor: Seiichiro Ohishi, Fukaya, Japan

[73] Assignee: Kabushiki Kaisha Toshiba, Kanagawa, Japan

[21] Appl. No.: 92,550

[22] Filed: Sep. 3, 1987

[30] Foreign Application Priority Data

Sep. 4, 1986 [JP] Japan .................. 61-208246

[51] Int. Cl.$^4$ .............................. H04N 5/14
[52] U.S. Cl. .................. 358/160; 340/750; 365/230.09; 365/189.08
[58] Field of Search ............. 358/160, 148, 149, 17, 358/13, 140, 78; 365/230; 340/250, 223

[56] References Cited

U.S. PATENT DOCUMENTS 4,101,926 7/1978 Dischert et al. .............. 358/17
4,148,070 4/1979 Taylor .................. 358/140 X
4,558,436 12/1985 Wagensonner et al. ......... 365/230

FOREIGN PATENT DOCUMENTS 0111362 6/1984 European Pat. Off. .
0140128 5/1985 European Pat. Off. .
2032220 4/1980 United Kingdom .
2126450 3/1984 United Kingdom .
2128051 4/1984 United Kingdom .

OTHER PUBLICATIONS

Japanese Patent Disclosure SHO 61-172496, Inventor: Masaaki Tamura, Published Aug. 4, 1986.

Primary Examiner—James J. Groody
Assistant Examiner—Victor R. Kostak
Attorney, Agent, or Firm—Finnegan, Henderson, Farabow, Garrett & Dunner

[57] ABSTRACT

A video signal memory apparatus for data display device. The display device receives an input video signal corresponding to video data in successive fields of a prescribed field period, each field period including an indicating period corresponding to a portion of the field displayed by the display device, and a blanking period corresponding to the remaining portion of the field. The video signal memory apparatus includes an address generator for generating address data corresponding to the video signals in the indicating period received by the apparatus, and a memory device for storing only the video data corresponding to the video signals in the indicating period in accordance with the corresponding address data from the address generator, thereby increasing the effective utilization rate of the memory.

5 Claims, 6 Drawing Sheets

VIDEO SIGNAL MEMORY APPARATUS AND METHOD WHICH EXCLUDES STORAGE OF BLANKING SIGNALS

BACKGROUND OF THE INVENTION

1. Field of the Invention

The present invention relates to a video signal memory apparatus and method, and more particularly to an apparatus and method for writing and reading video signals into or from a video signal memory.

2. Description of the Prior Art

Systems for storing a composite video signal in a memory and reading out the video signal therefrom are widely used in the field of video equipment, e.g., television receivers, video tape recorders and the like. In these systems, a conventional video signal memory apparatus for a video data display device, as shown in FIG. 1, is used for writing and reading the composite video signal into or from the memory.

In FIG. 1, an input terminal 10 for receiving a composite video signal Vin (referred to hereafter as "video signal" for simplicity) is coupled to a memory controller 12 through an analog-to-digital converter (hereafter abbreviated as "A/D converter") 14. The memory controller 12 is coupled to a memory 16 through a memory data bus 18. An address data bus 20 and a mode control signal bus 22 also are provided between the memory controller 12 and the memory 16. The memory controller 12 is coupled to an output terminal 24 for supplying an output video signal Vout through a digital-to-analog converter (hereafter abbreviated as "D/A converter") 26. The memory controller 12 includes a address generator 28 comprised of a counter 30 and a timing controller 32.

The operation of the conventional video signal memory apparatus, as shown in FIG. 1, will be described hereafter. For storing the input video signal Vin in the memory 16 or reading the output video signal Vout therefrom, the following operations are carried out. The input and output video signals to or from the video signal memory apparatus are analog signals. However, signals in the video signal memory apparatus are digitally processed. Therefore, the input video signal Vin of an analog configuration is converted to a first digital video signal DV1 of a digital configuration by the A/D converter 14 prior to reaching the memory controller 12. A second digital video signal DV2 of a digital configuration read out from the memory 16 is converted to the output video signal Vout of an analog configuration by the D/A converter 26 after leaving the memory controller 12. The A/D converter 14 converts the input video signal Vin to the first digital video signal DV1 in a conventional manner. For example, the input video signal Vin is sampled repeatdly at a predetermined frequency. Each sampled value of the input video signal Vin then is digitized into the first digital video signal DV1 comprised of a predetermined number of bits, e.g., N bits. The D/A converter 26 is constructed with the same bit structure, i.e., the N bit structure of the A/D converter 14.

The counter 30 of the address generator 28 performs a count operation. A count data CD of the counter 30 is applied to the timing controller 32. The timing of the count data CD is adjusted by the timing controller 32 and the data is applied to the memory 16 as address data AD for the memory 16. The count data CD and address data AD are comprised of N bits corresponding the number of bits of the first digital video signal DV1 and the second digital video signal DV2. The counter 30 is constructed with the N bit structure for generating address data AD of N bits. The memory controller 12 supplies the memory 16 with the address data AD generated by the address generator 28 through the address data bus 20.

The memory controller 12 also supplies the memory 16 with a mode control signal W/R through the mode control signal bus 22. The mode control signal W/R takes one binary level, e.g., "1" level or another binary level, e.g., "0" level in response to the write mode or the read mode.

The first digital video signal DV1 or the second digital video signal DV2 is written into the memory 16 or read out therefrom in accordance with the address data AD. The address data AD designates addresses of the memory 16 both in the write and read modes. The counter 30 sequentially counts up the count data CD so that the count data CD, i.e., the address data AD, varies from "0 0 0 . . . 0" through a prescribed bit state, e.g., "AN AN-1 AN-2 .. A1", respectively comprised of N bit data (A represents any of digit data 1 or 0, hereafter). The counts "0 0 0 . . . 0" through "AN AN-1 AN-2 . . . A1" correspond to the addresses of the memory 16, so that the first digital video signal DV1 or the second digital video signal DV2 and the address data AD have a relationship, as shown in FIGS. 2 and 3.

The memory 16 is set to the write mode, when a mode control signal W/R of level "1" is applied to the memory 16. In the write mode, the input video signal Vin is applied to the A/D converter 14 and converted to the first digital video signal DV1 therein. The first digital video signal DV1 then is processed in the memory controller 12 so that the first digital video signal DV1 is converted to write data WD suitable for the memory 16. The write data WD is written into the memory 16 in accordance with the address data AD. At the time, the counter 30 performs the count operation so that the address data AD "0 0 0 . . . 0" through "AN AN-1 AN-2 . . . A1" are successively supplied to the memory 16 through the address data bus 20.

The memory 16 is set to the read mode, when a mode control signal W/R of level "0" is applied to the memory 16. In the read mode, read data RD is read out from the memory 16 in accordance with the address data AD. At the time, the counter 30 also performs the count operation so that the address data AD "0 0 0 . . . 0" through "AN AN-1 AN-2 . . . A1" are successively supplied to the memory 16 through the address data bus 20. The read data RD is then processed in the memory controller 12, so that the read data RD is converted to the second digital video signal DV2. The second digital video signal DV2 is applied to the D/A converter 26 and then converted therein to the output video signal Vout. The output video signal Vout is obtained on the output terminal 24.

In the conventional video signal memory apparatus, the memory stores the video signal for its entire field period. The field period includes an indicating period T1 corresponding to the displayed portion of the video signal, and a blanking period T2 corresponding to the portion of the video signal which is not displayed. In other words, the memory was provided for storing the whole video signal, including an invalid video signal in the blanking period of each field, as well as a valid video signal corresponding to the indicating period of the field. Therefore, the conventional video signal memory apparatus had to have a considerably larger memory capacity capable of storing the video signal for its whole field period. Some amount of the memory capacity corresponding to the blanking period was wasted. As a result, the effective utilization rate of the memory capacity was reduced in the conventional video signal memory apparatus.

SUMMARY OF THE INVENTION

An object of the present invention is to provide a video signal memory apparatus in which a memory with a relatively small memory capacity is provided for storing a video signal.

Another object of the present invention is to provide a video signal memory apparatus in which the effective utilization rate of the memory capacity is increased.

A further object of the present invention is to provide a video signal memory apparatus which avoids writing a video signal into memory for blanking periods.

Another object of the present invention is to reduce the memory capacity necessary for storing a composite video signal.

This and other objects are achieved in the video signal digital memory control system for a video data display apparatus of the present invention. The apparatus receives a video signal in corresponding to the video data in successive fields of a prescribed field period, each field period including an indicating period corresponding to a portion of the field displayed by the display apparatus, and a blanking period corresponding to the remaining portion of the field. The system includes an address generator for generating address data corresponding to the video signals in the indicating period received by the apparatus, and a memory device for storing only the video data corresponding to the video signals in the indicating period in accordance with the corresponding address data from the address generator for increasing the effective utilization rate of the memory.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present invention will now be described in detail with reference to the accompanying drawings, namely, FIGS. 4 to 7.

Figure 4:
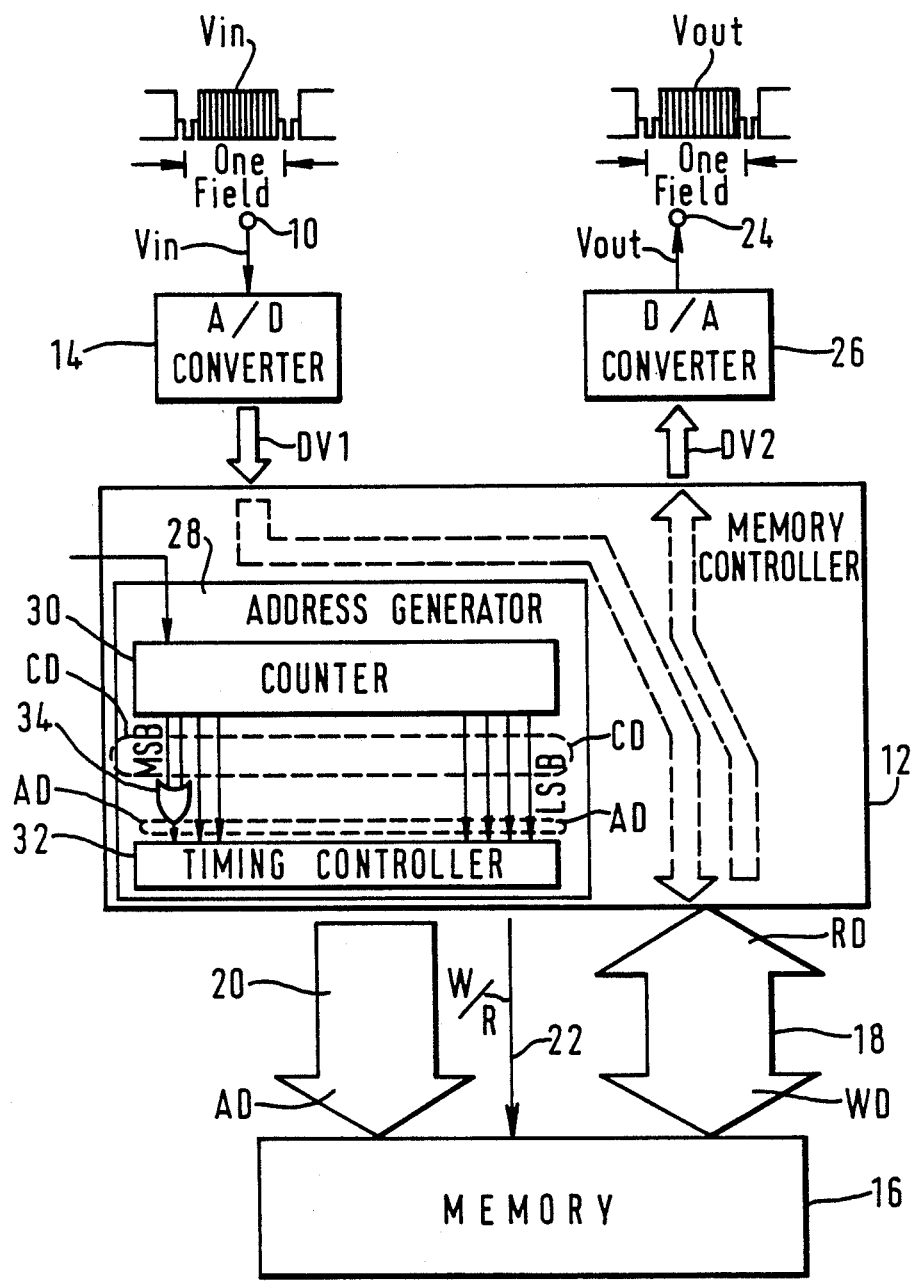
FIG. 4 is a block diagram showing an embodiment of a video signal memory apparatus according to the present invention.

FIG. 4 is a block diagram showing an embodiment of the video signal memory apparatus for a video data display device according to the present invention. The display device receives an input video signal corresponding to the video data in successive fields of a prescribed field period, each field period including an indicating period corresponding to a portion of the field displayed by the display device, and a blanking period corresponding to the remaining portion of the field.

In FIG. 4, an input terminal 10 for receiving an input video signal Vin is coupled to a memory controller 12 through an A/D converter 14. The memory controller 12 is coupled to a memory 16 through a memory data bus 18. An address data bus 20 and a mode control signal bus 22 also are provided between the memory controller 12 and the memory 16. The memory controller 12 is coupled to an output terminal 24 for supplying an output video signal Vout through a D/A converter 26. The memory controller 12 includes an address generator 28 comprised of a counter 30, a timing controller 32 and an OR gate 34.

Figure 1:
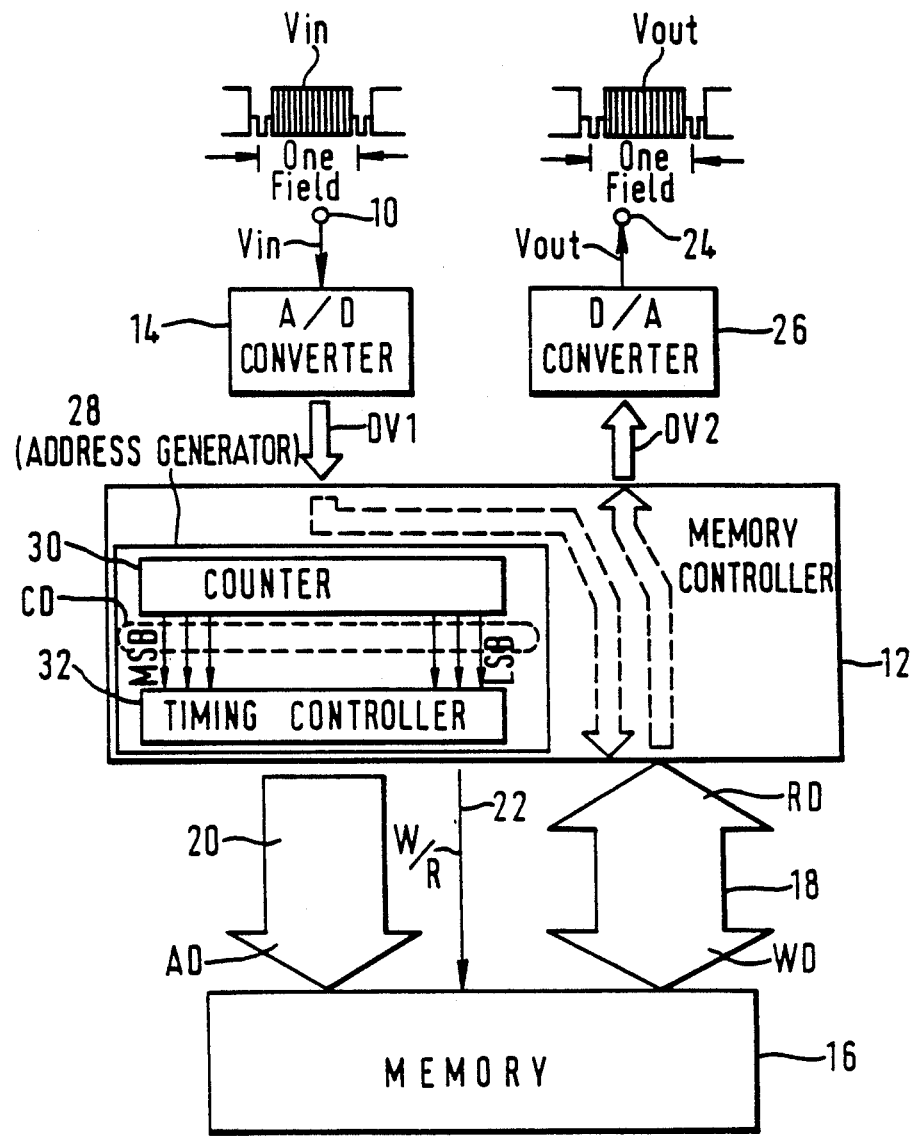
FIG. 1 is a block diagram showing a conventional video signal memory apparatus.
Figure 2:
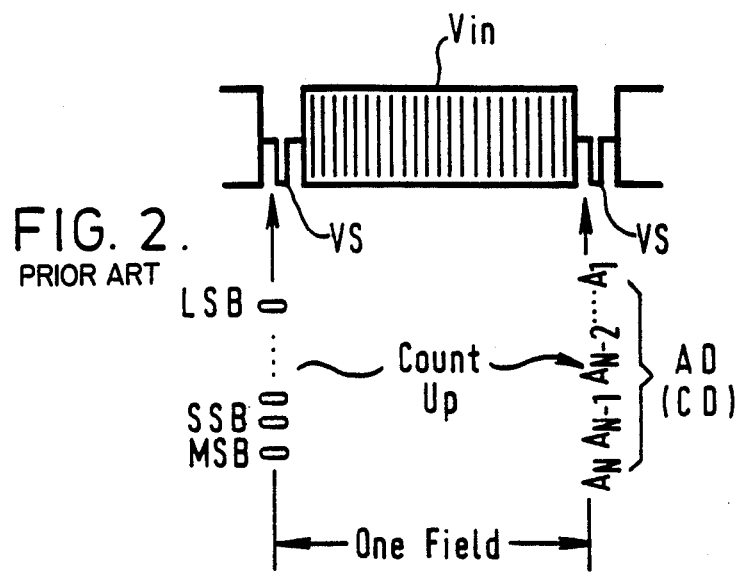
FIG. 2 is a diagram illustrating the relationship between the input video signal and the address data for explaining the operation of the circuit shown in FIG. 1 in the write mode.
Figure 3:
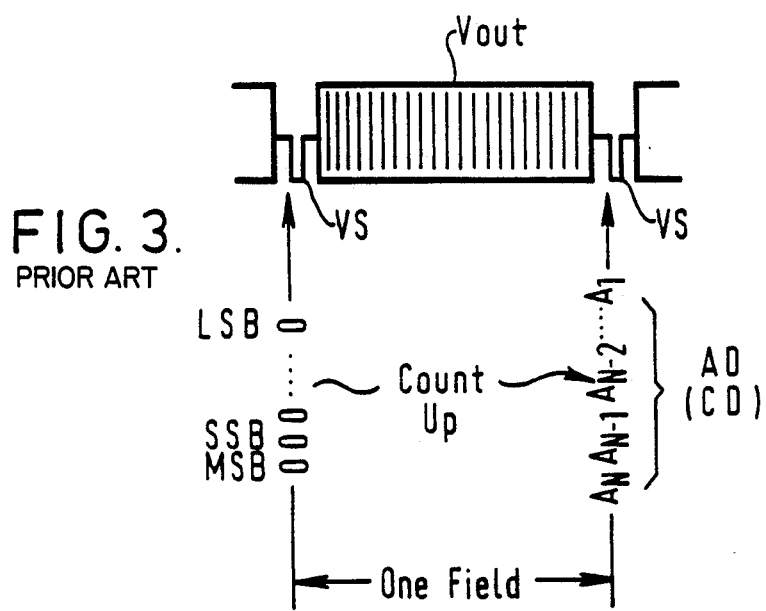
FIG. 3 is a diagram illustrating the relationship between the output video signal and the address data for explaining the operation of the circuit shown in FIG. 1 in the read mode.

The circuit construction of FIG. 4 is different from FIG. 1 in that the address generator 28 includes the OR gate 34 between the counter 30 and timing controller 32. The OR gate 34 has two inputs which are connected to a most significant bit (abbreviated as MSB hereafter) and a second significant bit (abbreviated as SSB hereafter) of bit-output terminals of the counter 30, respectively. The output of the OR gate 34 is coupled to the MSB of bit-input terminals of the timing controller 32. The counter 30 is constructed to have a bit scale larger than the timing controller 32 by one bit. When the timing controller 32 has N bits, the counter 30 has N+1 bits. As a result, the MSB and the SSB of the counter 30 are connected to the MSB of the timing controller 32 through the OR gate 34. The remaining bits of the counter 30 are directly coupled to corresponding bits of the timing controller 32, respectively.

Further, the circuit construction of the FIG. 4 is different from FIG. 1 in that the memory 16 has a memory capacity of a scale sufficient only for storing the video signals in the indicating period T1.

The operation of the video signal memory apparatus shown in FIG. 4 will be described hereafter. For storing the input video signal Vin into the memory 16 or reading the output video signal Vout therefrom, the following operations are carried out. In FIG. 4, the A/D converter 14, the memory 16 and the D/A converter 26 have circuit constructions almost the same as the corresponding circuits of FIG. 1. The memory controller 12 of FIG. 4 also has a circuit construction similar to the circuit of FIG. 1, except for the address generator 28. Therefore, the explanations for the operations of the address generator 28 will be made in detail, but the explanations for the similar circuit portions will be omitted.

Figure 5:
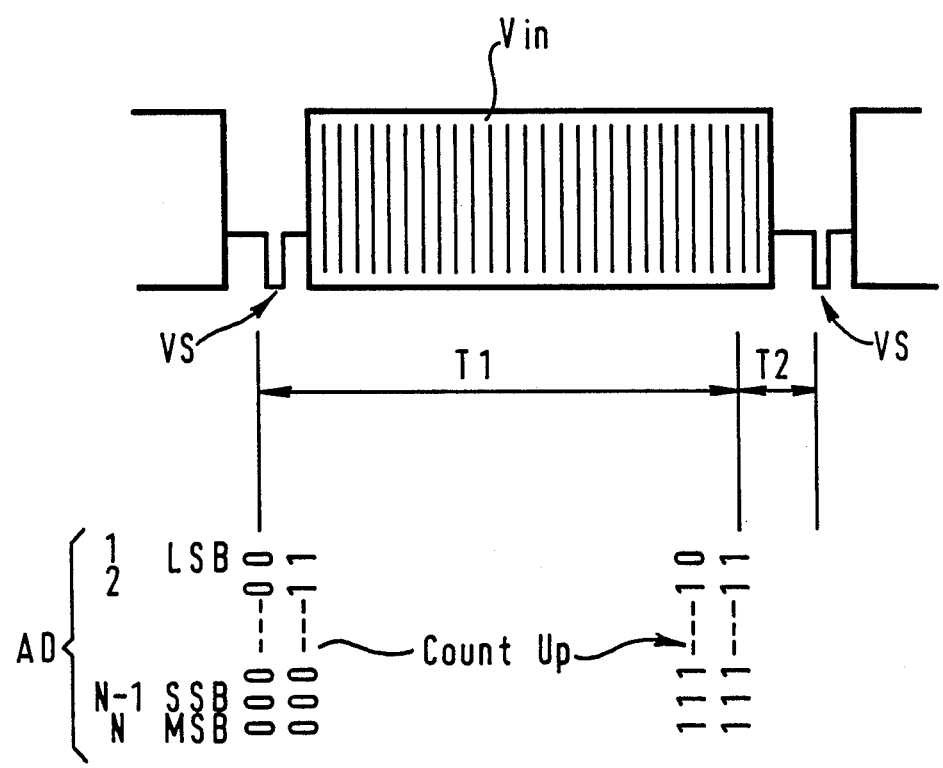
FIG. 5 is a diagram illustrating the relationship between the input video signal and the address data for explaining the operation of the circuit shown in FIG. 4 in the write mode.

Referring now to FIG. 5, the operation for writing the input video signal Vin into the memory 16 will be described. FIG. 5 shows the relationship between the input video signal Vin and the address data AD. In the drawing, references T1 and T2 correspond to the indicating period and the blanking period of each one field of the input video signal Vin, respectively. The blanking period T2 occurs immediately before the vertical synchronizing signal VS. The input video signal Vin in the indicating period T1, i.e, a valid video signal, is displayed on a display screen or the like. However, the input video signal Vin in the blanking period, i.e., the invalid video signal, does not appear on the display screen.

When the write mode is set, the counter 30 of N+1 bits in the address generator 28 is reset by the vertical synchronizing signal VS, so that the count data CD of the counter 30 initializes all N+1 bits to the bit state "0 0 0 ... )". The counter 30 is designed so that the N bits from the LSB to SSB of the count data CD becomes the bit state "1 1 1 ... 1" at the end of the indicating period T1. The counter 30 continues its count operation so that the count data CD of N+1 bits shifts to the bit state "1 0 0 0 ... 0" at the beginning of the blanking period T2. The counter 30 further continues to count up. The counter 30 provides the count data CD of a prescribed bit state, e.g., "1 0 AN-1 ... A2 A1" at the end of the blanking period T2. Then, the counter 30 again initializes all N+1 bits to the bit state "0 0 0 ... 0" by the vertical synchronizing signal VS.

The address data AD in the blanking period T2 are the same as the address data AD of a prescribed period in the indicating period T1. However, the memory 16 is temporarily shifted to the read mode state during the blanking period T2. The temporary mode change is made by the memory controller 12 in response to any bit change of the count data CD, e.g., of MSB to "1" at the beginning of the blanking period T2. Or, the MSB of the counter 30 is forcibly grounded during the write mode operation. Then, the MSB of the counter 30 is held at "0" during the write mode. Therefore, the memory 16 is prevented from writing the data of blanking period T2.

Except for its MSB, the count data CD, i.e., N bits from its LSB, varies sequentially from "0 0 0 ... 0" through "1 1 1 ... 1". The address data AD of N bits varies from "0 0 0 ... 0" through "1 1 1 ... 1" in correspondence with the count data CD. The valid video signal in the indicating period T1 thus is stored in the memory 16. The invalid video signal within the blanking period T2, however, is not written into the memory 16. As a result, the memory capacity of the memory 16 may be reduced by the storage capacity of the invalid video signal in the blanking period.

Figure 6:
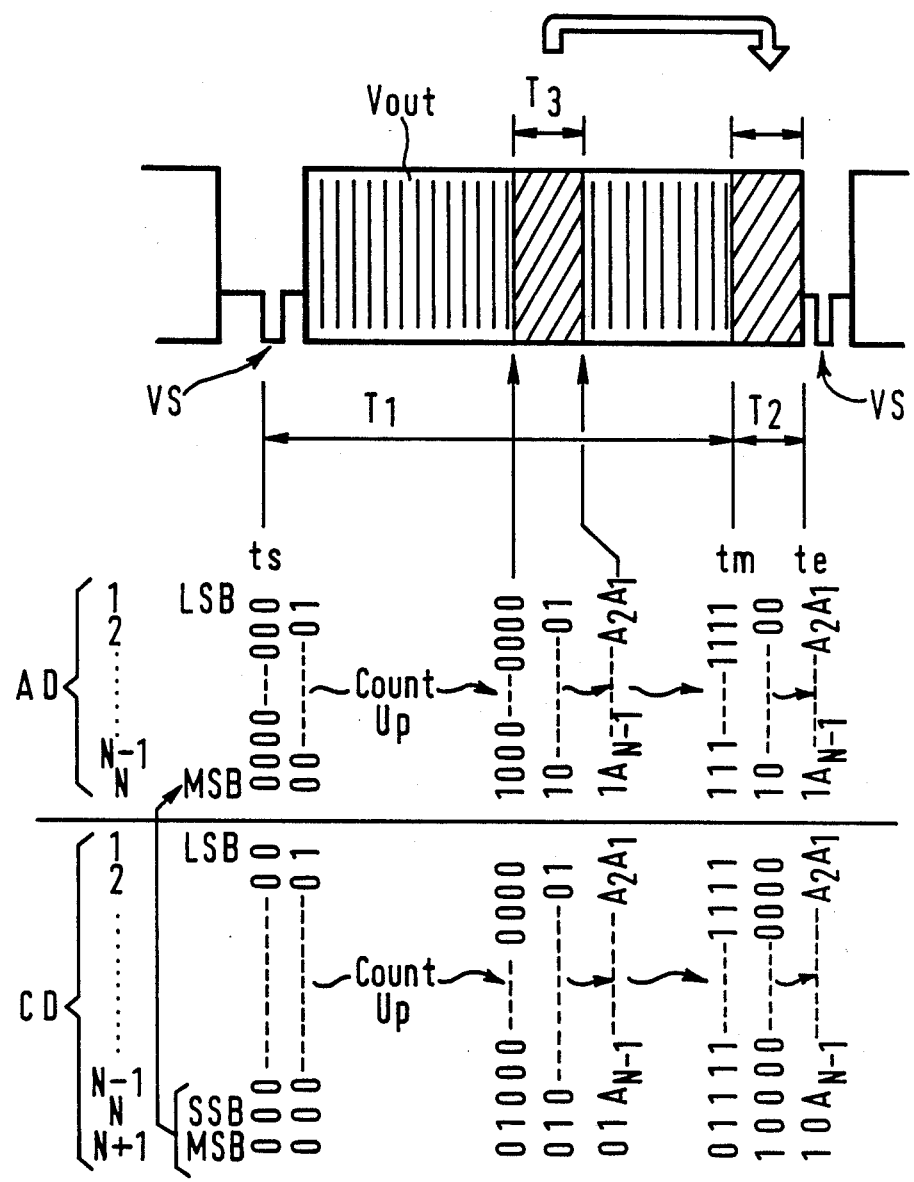
FIG. 6 is a diagram illustrating the relationship between the output video signal and the address data for explaining the operation of the circuit shown in FIG. 4 in the read mode.
Figure 7:
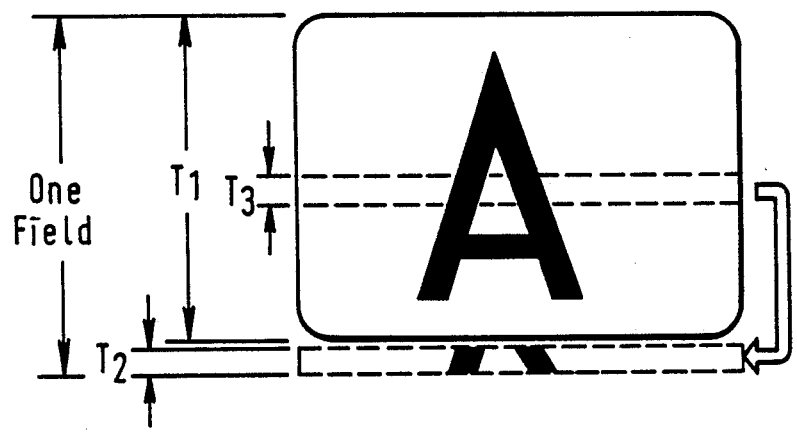
FIG. 7 is a diagram illustrating an example of an image displayed on a screen by the video signal memory apparatus according to the present invention.

Referring now to FIG. 6, the operation for reading the output video signal Vout from the video signal memory apparatus will be described. FIG. 6 shows relationships of the output video signal Vout with the count data CD and the address data AD. In the drawing, the indicating period and the blanking period of each one field of output video signal Vout are also denoted by the references indicating period T1 and blanking period T2, respectively.

In the read mode, the counter 30 counts up sequentially through its entire scale, i.e., N+1 bits, so that count data CD of N+1 bits is produced. Thus, in this system, at time tm the bits used for the address data AD (total N bits) are all "1". At the next clock pulse these bits all change to "0". However, as shown in FIG. 6, the MSB of the memory 16 is provided in excess. Since the MSB of the counter 30 is supplied to the MSB input of the timing controller 32 via the OR gate 34, the MSB of the address data AD is held at "1" even after time tm. As a result, as shown in FIG. 6, the address data AD, from time ts to time tm successively designates the addresses of the memory 16 which stores the valid video signal in the indicating period T1. Then from time tm to time te, it designates the addresses of the blanking period T2, which is shown in the drawing.

In this way, when the time te has been reached, the memory 16 (total N+1 bits) is reset by a reset signal, and a similar operation to the above is repeated. Now, supposing that, for example, the data for character A is housed in the memory 16. By means of the operation described above, the display will be as shown in FIG. 7. During the blanking period T2, the data for a period T3 will be repeatedly read. However since this data is in the blanking period of output video signal Vout, it will have no effect on the screen.

As explained above, this invention is designed to avoids writing data to memory for the blanking period, since this does not appear on the display as a video signal. When reading, the invention reads and substitutes other data which has been written to memory as an equivalent signal to the blanking period. Thus, this invention can improve the memory utilization factor. Moreover, since there is no need to access the memory during the blanking period for writing, a margin is created in the control circuit and reliability of operation is improved.

As described above, the present invention can provide significantly improved control circuit for a video signal memory for writing and reading video signals into or from the video signal memory.

The preferred embodiments of the present invention have been illustrated and described. It will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A video signal memory apparatus for a video data display device, the display device receiving input video signals, corresponding to video data, in successive fields of a prescribed field period, each field period including an indicating period corresponding to a portion of the field displayed by the display device, and a blanking period corresponding to the remaining portion of the field, the apparatus comprising:

address means for generating address data corresponding to the input video signals in the indicating period received by the apparatus;

memory means, responsive to said address means, for storing only the video data corresponding to the video signals in the indicating period in accordance with the corresponding address data, thereby increasing the effective utilization rate of the memory means;

means for reading the stored video data from the memory means; and repeat means for generating video signals having the prescribed field period by supplementing the video data from the memory means corresponding to the indicating period.

2. The video signal memory apparatus of claim 1 further comprising a timing controller for adjusting the timing of the address data supplied to the memory means.

3. The video signal memory apparatus of claim 1 wherein the repeat means includes a counter and a logic means for controlling the output of the counter to the memory means.

4. The video signal memory apparatus of claim 3 wherein the counter includes a most significant bit and a second significant bit, and the logic means includes an OR gate including two inputs, one input connected to the most significant bit and the other input connected to the second significant bit.

5. A method for controlling a video data display device comprising the steps of:

receiving video signals corresponding to the video data in successive fields having a prescribed field period, only a first portion of said prescribed field period of each of said successive fields being displayed by the display device;

generating address data corresponding only to said first portion of said successive fields;

storing only the video data corresponding to the video signals in said first portion of each of said successive fields in accordance with said generated address data;

reading said stored video data; and generating video signals having said prescribed field period by supplementing said stored video data with repeated stored video data.

* * * * *